(12) United States Patent
Cui et al.

(10) Patent No.: US 12,426,258 B2
(45) Date of Patent: Sep. 23, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Zhaopei Cui, Hefei (CN); Ying Song, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 539 days.

(21) Appl. No.: 17/937,355

(22) Filed: Sep. 30, 2022

(65) Prior Publication Data

US 2023/0371245 A1 Nov. 16, 2023

Related U.S. Application Data

(63) Continuation of application No. PCT/CN2022/096237, filed on May 31, 2022.

(30) Foreign Application Priority Data

May 16, 2022 (CN) .......................... 202210526973.3

(51) Int. Cl.
    *H10B 12/00* (2023.01)
(52) U.S. Cl.
    CPC ........... *H10B 12/485* (2023.02); *H10B 12/30* (2023.02)
(58) Field of Classification Search
    CPC .. H10B 12/485; H10B 12/30; H10B 12/0335; H10B 12/315
    See application file for complete search history.

(56) References Cited

U.S. PATENT DOCUMENTS

| 8,198,189 B2 | 6/2012 | Kim |
| 2010/0285662 A1 | 11/2010 | Kim |
| 2012/0217631 A1 | 8/2012 | Kim |
| 2015/0171163 A1 | 6/2015 | Lee et al. |
| 2016/0329337 A1* | 11/2016 | Hwang .............. H10B 12/0335 |

(Continued)

FOREIGN PATENT DOCUMENTS

| CN | 103681677 B | 7/2018 |
| CN | 104103578 B | 7/2018 |

(Continued)

*Primary Examiner* — Yasser A Abdelaziz
(74) *Attorney, Agent, or Firm* — SYNCODA LLC; Feng Ma

(57) ABSTRACT

A semiconductor structure includes a substrate, wire structures, support structures and storage node contact structures. Each wire structure includes a wire and an isolation structure located on the wire. The wire structures extend along a first direction. The support structures are located on a side of the wire structures away from the substrate. The support structures are arranged at intervals in the first direction and connected with the isolation structures. The support structures extend along a second direction, and the second direction intersects with the first direction. The storage node contact structures are arranged in contact holes, and each of the contact holes is located within adjacent wire structures and adjacent support structures. A first air gap structure is provided between each of the storage node contact structures and a wire structure adjacent to the storage node contact structure.

9 Claims, 24 Drawing Sheets

(56) References Cited

U.S. PATENT DOCUMENTS

| | | | |
|---|---|---|---|
| 2019/0296026 A1* | 9/2019 | Ji | H01L 21/31144 |
| 2020/0118929 A1* | 4/2020 | Kim | H01L 23/5329 |
| 2020/0388619 A1* | 12/2020 | Sukekawa | H01L 21/0217 |
| 2021/0296350 A1 | 9/2021 | Jin | |
| 2022/0013526 A1 | 1/2022 | Kwon | |
| 2022/0077159 A1 | 3/2022 | Li | |
| 2022/0085032 A1 | 3/2022 | Ping et al. | |
| 2022/0122976 A1 | 4/2022 | Kim | |
| 2022/0319915 A1 | 10/2022 | Cui et al. | |

FOREIGN PATENT DOCUMENTS

| | | |
|---|---|---|
| CN | 111524887 A | 8/2020 |
| CN | 111710642 A | 9/2020 |
| CN | 112885782 A | 6/2021 |
| CN | 113097148 A | 7/2021 |
| CN | 113921499 A | 1/2022 |
| CN | 114373735 A | 4/2022 |
| CN | 115148676 A | 10/2022 |

\* cited by examiner

SEMICONDUCTOR STRUCTURE AND MANUFACTURING METHOD THEREOF

CROSS-REFERENCE TO RELATED APPLICATIONS

This is a continuation of International Patent Application No. PCT/CN2022/096237 filed on May 31, 2022, which claims priority to Chinese Patent Application No. 202210526973.3 filed on May 16, 2022. The disclosures of the above-referenced applications are hereby incorporated by reference in their entirety.

BACKGROUND

A dynamic random access memory (DRAM) is a semiconductor memory commonly used in electronic devices such as computers, and the DRAM is composed of multiple memory cells. A memory cell includes a memory capacitor and a transistor electrically connected with the memory capacitor. The transistor includes a gate electrode, a source region and a drain region. The gate electrode of the transistor is used for electrical connection with a word line. A source region of the transistor is used to form a bit line contact region to be electrically connected with a bit line through a bit line contact structure. A drain region of the transistor is used to form a storage node contact region to be electrically connected with the memory capacitor through a storage node contact structure.

SUMMARY

The present disclosure relates to the field of semiconductor manufacturing technology, in particular to a semiconductor structure and a manufacturing method thereof.

According to an aspect of the present disclosure, there is provided a semiconductor structure. The semiconductor structure includes a substrate, wire structures, support structures, storage node contact structures and first air gap structures. The wire structures are arranged on the substrate at intervals. Each of the wire structures includes a wire and an isolation structure located on the wire. The wire structures extend along a first direction. The support structures are located on a side of the wire structures away from the substrate. The support structures are arranged at intervals in the first direction and connected with the isolation structures. The support structures extend along a second direction, and the second direction intersects with the first direction. The storage node contact structures are arranged in contact holes, and each of the contact holes is located within adjacent wire structures and adjacent support structures. A first air gap structure is provided between each of the storage node contact structures and a wire structure adjacent to the storage node contact structure.

According to another aspect of the present disclosure, there is provided a method for manufacturing a semiconductor structure. The method is used to manufacture a semiconductor structure as described in some of the above embodiments, the method including the following operations.

A substrate is provided.

A plurality of wire structures distributed at intervals are formed on the substrate. Each of the wire structures includes a wire and an isolation structure located on the wire, and the wire structures extend along a first direction.

Support structures are formed on a side of the wire structures away from the substrate. The support structures are arranged at intervals in the first direction and connected with isolation structures, the support structures extend along a second direction, the second direction intersects with the first direction, and a contact hole is located within adjacent wire structures and adjacent support structures.

Storage node contact structures are formed in contact holes.

A first air gap structure is formed between each of the storage node contact structures and a wire structure adjacent to the storage node contact structure.

Details of one or more embodiments of the present disclosure are set forth in the following accompanying drawings and description. Other features, objects and advantages of the present disclosure will become apparent from the description, accompanying drawings and claims.

BRIEF DESCRIPTION OF THE DRAWINGS

In order to explain more clearly technical solutions of the embodiments of the disclosure, accompanying drawings required in the description of the embodiments will be introduced simply below. Obviously, the drawings in the below description are only used for some embodiments of the disclosure, and drawings of other embodiments may be acquired based on these drawings by those skilled in the art without creative efforts.

DETAILED DESCRIPTION

Figure 1:
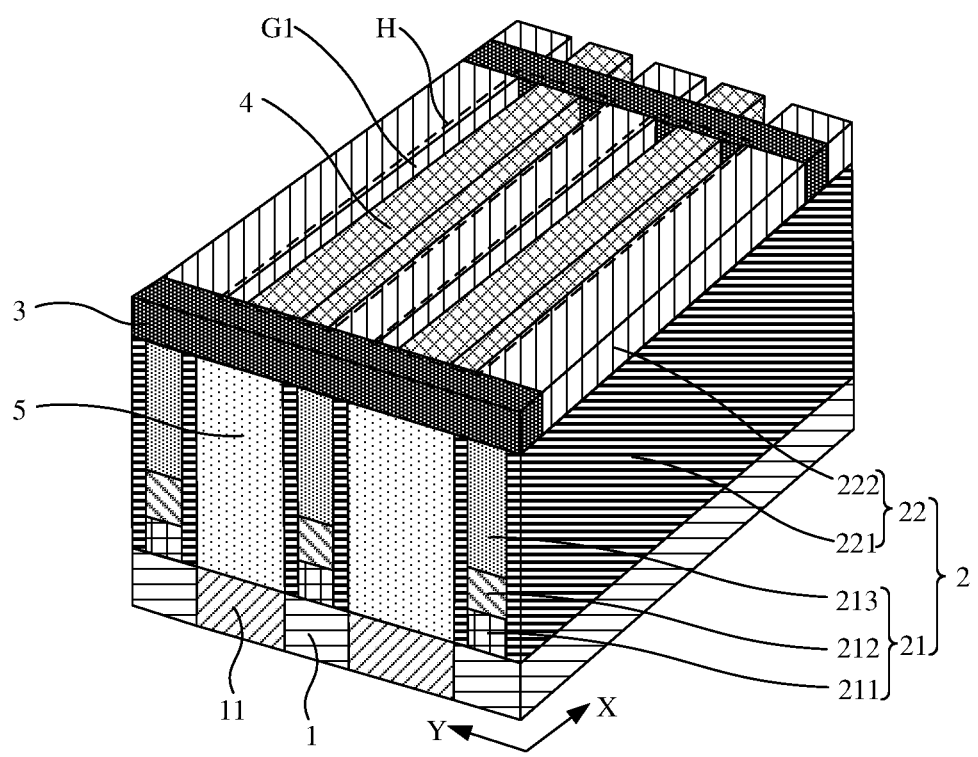
FIG. 1 is a schematic diagram of a semiconductor structure provided in an embodiment.

For ease of understanding the present disclosure, a more complete description will be given below with reference to the related drawings. Preferred embodiments of the present disclosure are given in the accompanying drawings. However, the present disclosure may be implemented in many different forms and is not limited to the embodiments described herein. Rather, these embodiments are provided with a view to making the disclosure of the present disclosure more thorough and comprehensive.

Unless otherwise defined, all technical and scientific terms used herein have the same meanings as are commonly understood by those skilled in the art of the present disclosure. Terms used in the description of the present disclosure are for the purpose of describing specific embodiments only and are not intended to limit the present disclosure. The term "and/or" as used herein includes any and all combinations of one or more related listed items.

It should be understood that when an element or layer is referred to as "on", "connected to" or "coupled to" another element or layer, it may be directly on, connected to or coupled to the other element or layer, or may exist intervening elements or layers. In contrast, when an element is referred to as being "directly on", "directly connected to" or "directly coupled to" other element or layer, there are no intervening elements or layers present. It should be understood that while the terms first, second, third, etc. may be used to describe various elements, components, regions, layers, and/or portions, such elements, components, regions, layers, and/or portions should not be limited by such terms. These terms are used only to distinguish one element, component, region, layer, or portion from another element, component, region, layer, or portion. Thus, the first element, component, region, layer, or portion discussed below may be represented as a second element, component, region, layer, or portion without departing from the teachings of the present disclosure.

Spatial relation terms such as "under", "below", "at the bottom of", "lower", "above", "on", etc. may be used herein for convenience of description to describe the relationship of one element or feature illustrated in the figure to other elements or features. It should be understood that the spatial relationship term is intended to include different orientations of devices in use and operation in addition to the orientations illustrated in the figure. For example, if the device in the drawings is flipped, then the element or feature described as "under the other element" or "below the other element" or "at the bottom of the other element" will be oriented "over" the other element or feature. Thus, the exemplary terms "below" and "under" may include both over and under orientations. The device may be additionally oriented (rotated 90 degrees or other orientation) and the spatial descriptors used herein are interpreted accordingly.

The term used herein is intended to describe specific embodiments only and is not to be a limitation of the present disclosure. As used herein, the singular forms of "a", "an" and "said/the" are also intended to include the plural, unless the context clearly indicates otherwise. It should also be understood that the terms "composed of" and/or "including", when used in this description, determine the presence of said features, integers, steps, operations, elements and/or components, but do not exclude the presence or addition of one or more other features, integers, steps, operations, elements, components and/or groups. As used herein, the term "and/or" includes any and all combinations of related listed items.

Embodiments of the disclosure are described herein with reference to cross-sectional views that are schematic diagrams of ideal embodiments (and intermediate structures) of the present disclosure, so that changes in the illustrated shape due to, for example, manufacturing techniques and/or tolerances can be expected. Thus, embodiments of the present disclosure should not be limited to specific shape of the regions illustrated herein but include shape deviations due to for example manufacturing techniques. The regions illustrated in the figure are schematic in nature and their shapes do not represent the actual shapes of the regions of the device and do not limit the scope of the present disclosure.

Referring to FIG. 1, there is provided a semiconductor structure in some embodiments of the present disclosure. The semiconductor structure includes a substrate 1, wire structures 2, support structures 3 and storage node contact structures 4. The wire structures 2 are arranged on the substrate 1 at intervals. Each of the wire structure 2 includes a wire 21 and an isolation structure 22 located on the wire 21, and the wire structures 2 extend along a first direction. The support structures 3 are located on a side of the wire structures 2 away from the substrate 1. The support structures 3 are arranged at intervals in the first direction and connected with isolation structures 22, the support structures 3 extend along a second direction, and the second direction intersects with the first direction. The storage node contact structures 4 are arranged in contact holes. Each of the contact holes H is located within adjacent wire structures 2 and adjacent support structures 3. A first air gap structure G1 is provided between each of the storage node contact structures 4 and a wire structure 2 adjacent to the storage node contact structure.

In some embodiments of the present disclosure, the substrate 1 may be constructed of a semiconductor material. The substrate 1 may have a single-layer structure or a multi-layer structure. For example, the substrate 1 may be such as a silicon (Si) substrate, a silicon germanium (SiGe) substrate, a silicon germanium carbon (SiGeC) substrate, a silicon carbide (SiC) substrate, a gallium arsenide (GaAs) substrate, indium arsenide (InAs) substrate, indium phosphide (InP) substrate, or other III/V semiconductor substrates or II/VI semiconductor substrates. Alternatively, for example, the substrate 1 may be a layered substrate including such as Si/SiGe, Si/SiC, silicon on insulator (SOI) or silicon germanium on insulator.

In some embodiments of the present disclosure, the substrate 1 includes a shallow trench isolation structure 11, by which the active region is isolated and formed within substrate 1. The shallow trench isolation structure 11 is for example a silicon oxide (SiO2) isolation structure. A plurality of active regions arranged in an array are isolated and formed within the substrate 1 by the shallow trench isolation structure 11. A storage node contact structure 4 is arranged in a corresponding contact hole H. The contact hole H may be a round hole, an elliptical hole, a rectangular hole or a special-shaped hole. The embodiment of the present disclosure is not limited to the shape and size of the contact hole H.

In addition, in the embodiment of the present disclosure, the contact hole H refers to a three-dimensional non-physical space formed by the intersection of the adjacent wire structures 2 and the adjacent support structures 3, and the hole space can expose a part of the surface of the active regions for realizing the contact connection between other structures and the active regions.

In some embodiments of the present disclosure, a wire structure 2 may be a bit line structure but is not limited thereto. The wire structure 2 extends in a first direction such as the X direction illustrated in FIG. 1. The wire structure 2 includes a wire 21 and an isolation structure 22. The wire 21 may be a single-layer structure or a laminated structure. The isolation structure 22 includes at least sidewall isolation structures 221, and the sidewall isolation structures are located on sidewalls of the wire.

In some embodiments of the present disclosure, the wire 21 includes a first conductive layer 211, a second conductive layer 212 and an insulating layer 213 that are stacked in a direction away from the substrate 1. The first conductive layer 211 may be, for example, a doped polysilicon layer or a germanium silicon layer having a conductive function. The second conductive layer 212 may be, for example, a tungsten metal layer. The insulating layer 213 may be, for example, a silicon nitride layer, a silicon oxide layer or a silicon oxynitride layer. Also the thickness of the insulating layer 213 can be selectively set according to actual requirements.

In some embodiments of the present disclosure, the wire 21 may also include a barrier layer (not illustrated) between the first conductive layer 211 and the second conductive layer 212. The barrier layer may be, for example, a titanium nitride layer or a titanium layer.

In some embodiments of the present disclosure, the support structures 3 extend along a second direction, and the second direction intersects with the first direction. The second direction is for example the Y direction illustrated in FIG. 1. In some embodiments of the present disclosure, the second direction is perpendicular to the first direction.

In some embodiments of the present disclosure, a support structure 3 may be a silicon carbon nitrogen (SiCN) layer or a laminated structure including the SiCN layer. The support structures 3 are arranged at intervals in the first direction and may intersect with the wire structures 2 in a grid shape. The contact hole H is located within the adjacent wire structures 2 and the adjacent support structures 3, which can be represented as: the contact hole H is located in any one of the grids formed by the intersection of the support structures 3 and the wire structures 2.

Here, the supporting structures 3 are located on a side of the wire structures 2 away from the substrate 1 and intersect with the conductor structures 2. The supporting structures 3 can provide a supporting force for the conductor structures 2, so as to improve the structural strength of the wire structures 2 and avoid inclination or collapse of the conductor structures 2 during formation process. Therefore, on the premise of ensuring the depth-to-width ratio of the conductor structures 2, the structural stability of the conductor structures 2 can be effectively improved, so as to improve the electrical performance parameters and signal transmission quality of the wire structures 2 and improve yield of the device.

In some embodiments of the present disclosure, with continued reference to FIG. 1, the isolation structure 22 includes sidewall isolation structures 221 and a top isolation structure 222.

The sidewall isolation structures 221 are provided on sidewalls of the wire 21. The sidewall isolation structures 221 may be formed of a dielectric material having a higher dielectric constant such as a single dielectric layer or a stack of multiple dielectric layers. In some embodiments of the present disclosure, the sidewall isolation structures 221 are used to insulate the corresponding wire 21 and may employ a structure formed by stacking a first silicon nitride layer, a silicon oxide layer and a second silicon nitride layer. In some embodiments of the present disclosure, a first air gap structure G1 is provided between a storage node contact structure 4 and a top isolation structure 222 of a wire structure 2 adjacent to the storage node contact structure 4.

The top isolation structure 222 is provided on the sidewall isolation structures 221 and the wire 21. The top isolation structure 222 may, for example, cover at least a part of the top surfaces of the sidewall isolation structures 221 and the wire 21. In some embodiments of the present disclosure, the top isolation structure 222 is located between the adjacent support structures 3 and connected with the adjacent support structures 3. In some embodiments of the present disclosure, the upper surface of the top isolation structure 222 away from substrate 1 is aligned with the upper surface of the support structure 3 away from substrate 1. In some embodiments of the present disclosure, the top isolation structure 222 and the support structure 3 have the same thickness. In some embodiments of the present disclosure, the top isolation structure 222 may be a silicon nitride layer.

In some embodiments of the present disclosure, the storage node contact structure 4 may be a single-layer structure or a laminated structure. In some embodiments of the present disclosure, the storage node contact structure 4 includes a doped polysilicon layer, but is not limited thereto.

In some embodiments of the present disclosure, with continued reference to FIG. 1, the semiconductor structure further includes first dielectric layers 5. Each of the first dielectric layers 5 is located between adjacent wire structures 2 and below the support structures 3. The first dielectric layer 5 is formed of an insulating material, for example, the first dielectric layer 5 includes a silicon oxide layer. The first dielectric layer 5 is located between the adjacent wire structures 2 and below the support structures 3. The first dielectric layer 5 can support the support structures 3 on the basis of insulating the adjacent wire structures 2, so as to improve the support strength of the support structures 3.

Figure 2:
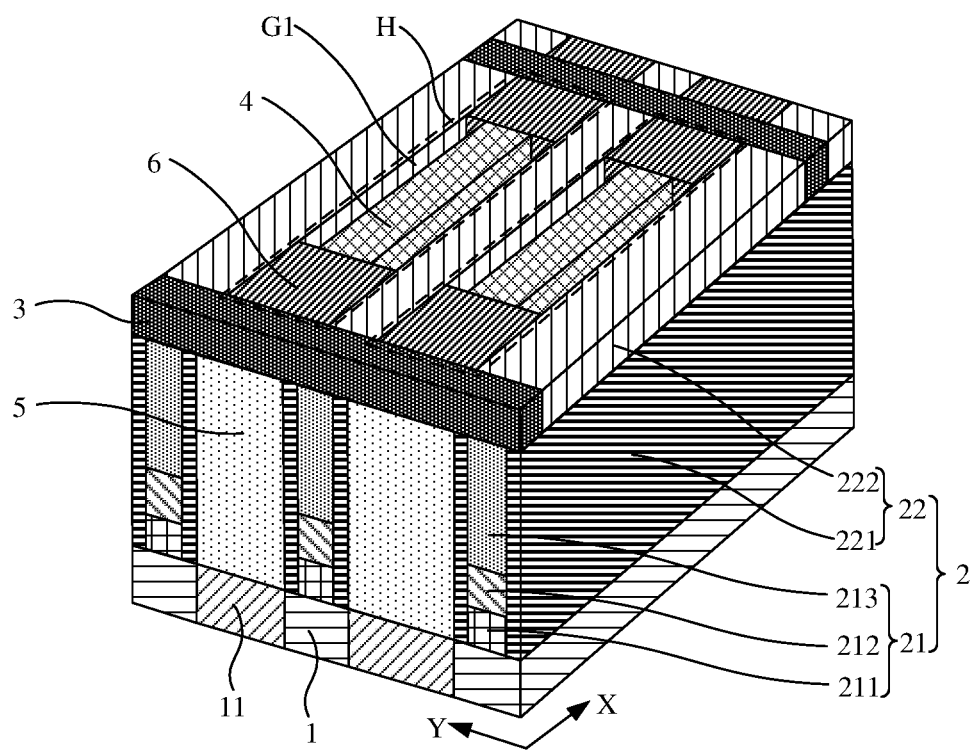
FIG. 2 is a schematic diagram of another semiconductor structure provided in an embodiment.

In some embodiments of the present disclosure, referring to FIG. 2, the semiconductor structure further includes second dielectric layers 6. Each of the second dielectric layers 6 is located between a storage node contact structure 4 and a support structure adjacent to the storage node contact structure 4. For example, the second dielectric layer 6 is provided on the sidewall of the first dielectric layer 5 and the sidewall of the support structure 3. In this way, the second dielectric layer 6 can be used to further improve the insulating effect and assist in defining the shape of the first air gap structure G1.

In some embodiments of the present disclosure, the second dielectric layer 6 and the first dielectric layer 5 may be formed of different materials. The second dielectric layer 6 is, for example, a silicon nitride layer.

In the embodiment of the present disclosure, through arranging the support structures 3 on the side of the wire structures 2 away from the substrate 1, the support structures 3 extending along different directions can be used to assist the manufacturing of the wire structures 2 with higher depth-to-width ratio and stable structure. In addition, based on the height of the top isolation structure 222 of the wire structure 2 and the support structure 3, the contact hole H is formed in the adjacent wire structures 2 and adjacent support structures 3, which can effectively increase the volume of the contact hole H, thereby facilitating the manufacturing of a storage node contact structure 4 with a larger volume in the contact hole H, and reducing the contact resistance of the storage node contact structure 4.

Furthermore, in the embodiment of the present disclosure, the first air gap structure G1 is arranged between each of the storage node contact structures 4 and a wire structure 2 adjacent to the storage node contact structure 4, and the parasitic capacitance between the storage node contact structure 4 and the wire 21 can be effectively reduced by using the first air gap structure G1. The first air gap structure G1 extends along a first direction X in some embodiments. The embodiment of the present disclosure does not limit the volume and shape of the air gap in the first air gap structure G1, and can be selected and set according to actual requirements.

In view of the above, the embodiment of the present disclosure can effectively improve the electrical performance of the semiconductor structure, so as to improve the use reliability and yield of the semiconductor structure.

Figure 3:
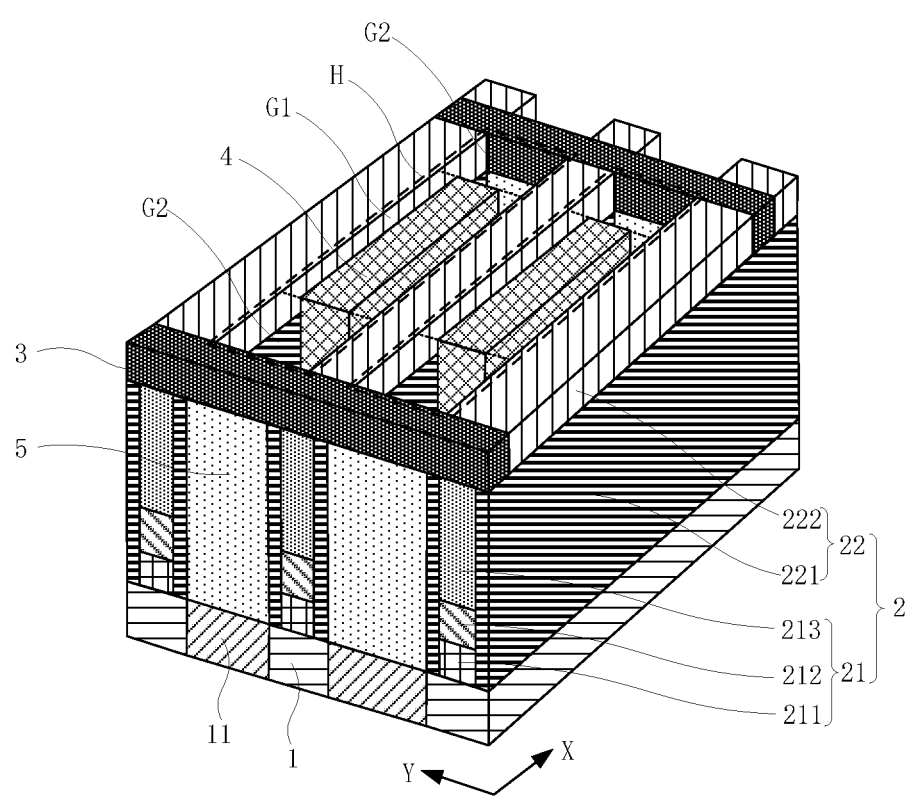
FIG. 3 is a schematic diagram of yet another semiconductor structure provided in an embodiment.

Referring to FIG. 3, in some embodiments of the present disclosure, a second air gap structure G2 is provided between each of the storage node contact structures 4 and a support structure 3 adjacent to the storage node contact structure 4. Here, the second air gap structure G2 is located at both ends of the storage node contact structure 4 along the second direction Y in some embodiments, or may be provided at one end of the storage node contact structure 4. The embodiment of the present disclosure does not limit the volume and shape of the air gap in the second air gap structure G2, and can be selected and set according to actual requirements.

In some embodiments of the present disclosure, an air gap in the second air gap structure G2 is communicated with an air gap in the first air gap structure G1.

In some embodiments of the present disclosure, the second air gap structure G2 and the first air gap structure G1 may be formed synchronously, or one is formed at a time.

In the embodiment of the present disclosure, the second air gap structure G2 is provided between a storage node contact structure 4 and a support structure 3, and the parasitic capacitance between the storage node contact structure 4 and the wire 21 can be further reduced by using the second air gap structure G2 on the basis of effectively reducing the parasitic capacitance between the storage node contact structure 4 and the wire 21 by using the first air gap structure G1.

Figure 4:
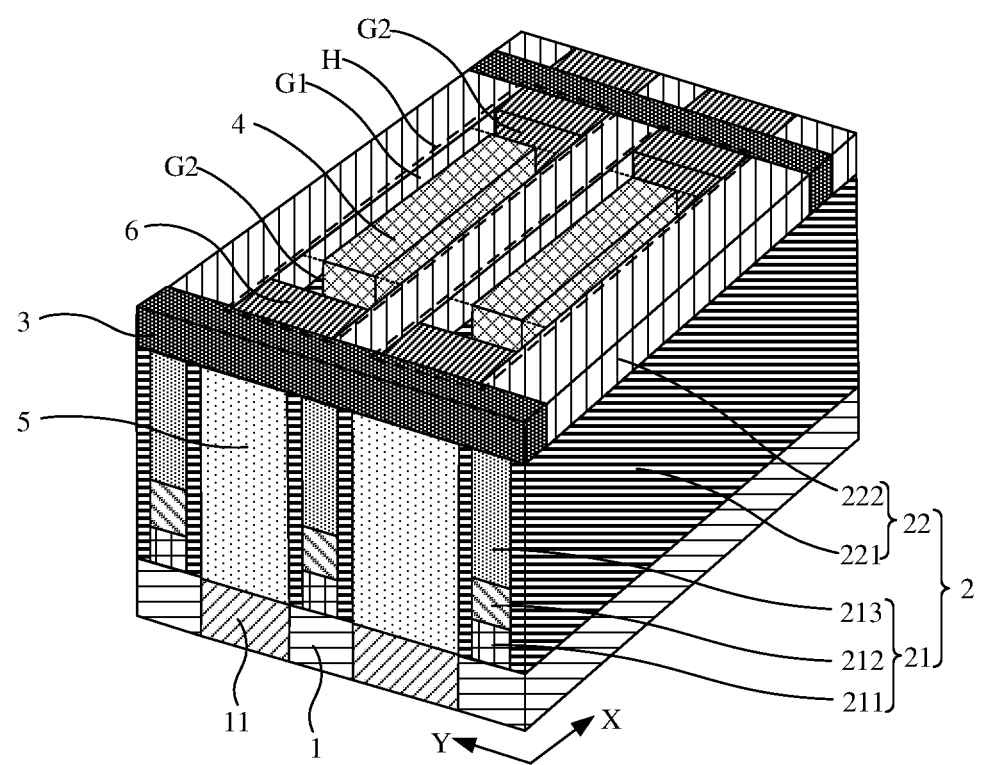
FIG. 4 is a schematic diagram of yet another semiconductor structure provided in an embodiment.

In some embodiments of the present disclosure, referring to FIG. 4, the semiconductor structure further includes second dielectric layers 6. A second air gap structure G2 between the storage node contact structure 4 and a support structure 3 adjacent to the storage node contact structure 4 may be located between the storage node contact structure 4 and the second dielectric layer 6. In this way, the second dielectric layer 6 can be used to improve the insulating effect and assist in defining the shape of the first air gap structure G1 and the second air gap structure G2.

Figure 5:
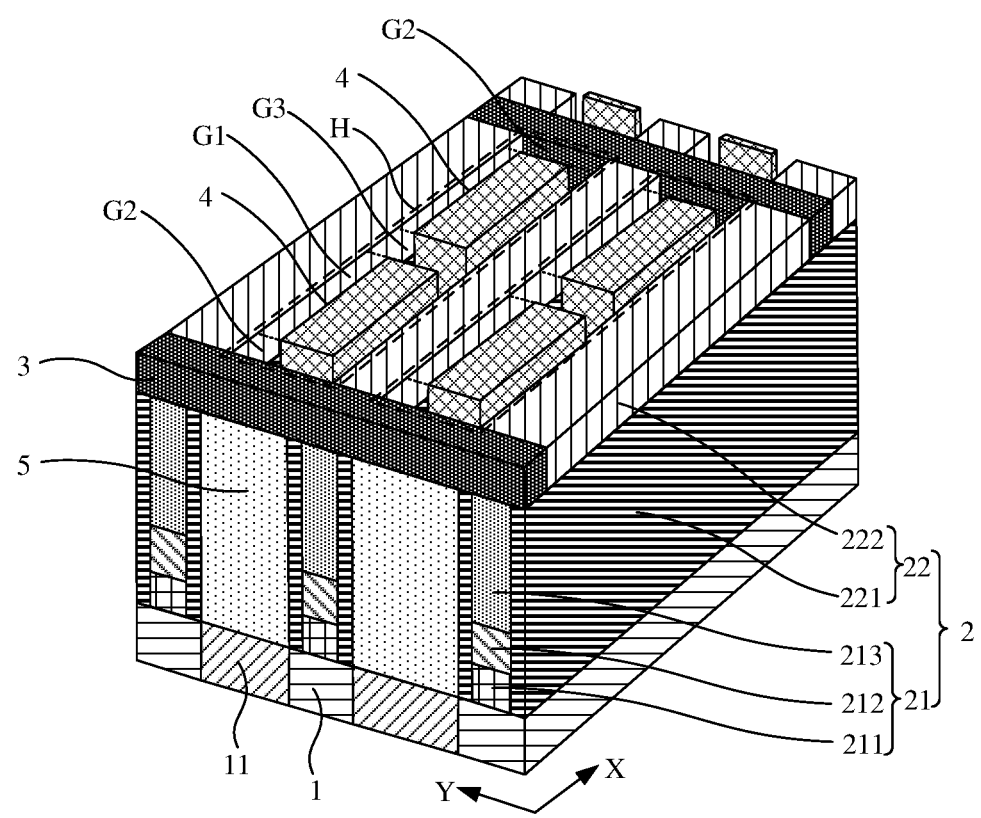
FIG. 5 is a schematic diagram of yet another semiconductor structure provided in an embodiment.

In some embodiments of the present disclosure, referring to FIG. 5, a plurality of storage node contact structures 4 are arranged in a same contact hole H which is located within two adjacent wire structures 2 and adjacent two support structures 3. It can be understood that adjacent storage node contact structures 4 are insulated from each other.

In some embodiments of the present disclosure, as illustrated in FIG. 5, a third air gap structure G3 is provided between adjacent storage node contact structures 4 located in the same contact hole H. That is, adjacent storage node contact structures 4 in the same contact hole H may be insulated by the third air gap structure G3. The embodiment of the present disclosure does not limit the volume and shape of the air gap in the third air gap structure G3, and can be selected and set according to actual requirements.

In some embodiments of the present disclosure, an air gap in the third air gap structure G3 is communicated with an air gap in the second air gap structure G2 and/or an air gap in the first air gap structure G1.

In some embodiments of the present disclosure, the third air gap structure G3, the second air gap structure G2 and the first air gap structure G1 may be formed synchronously, or one is formed at a time.

Figure 6:
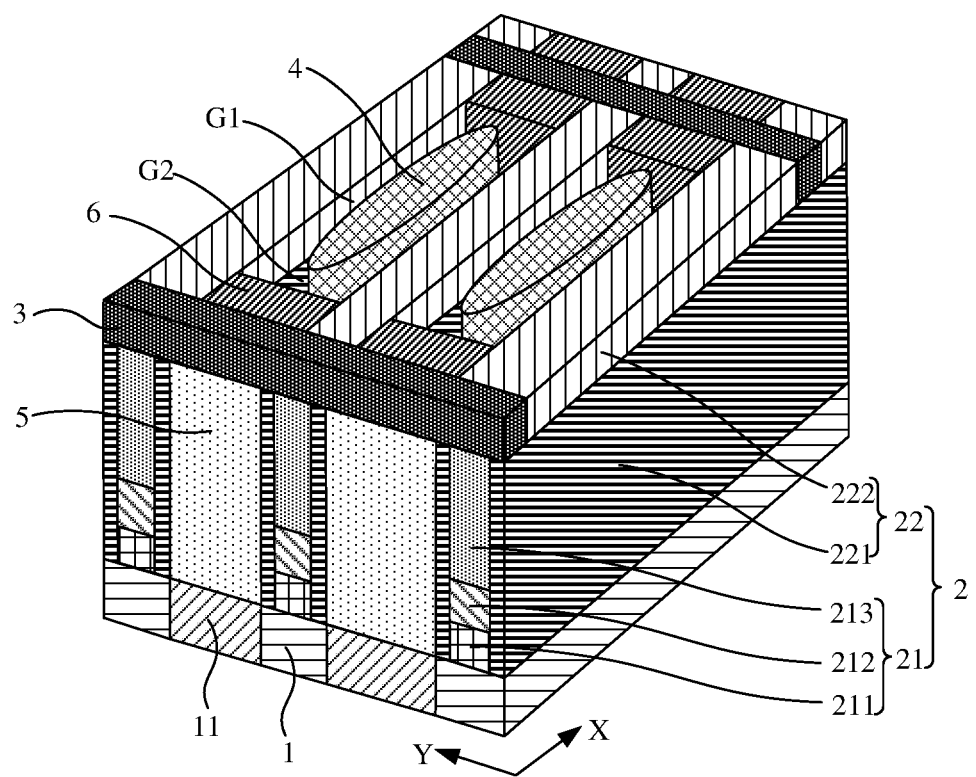
FIG. 6 is a schematic diagram of yet another semiconductor structure provided in an embodiment.

In addition, referring to FIG. 1-FIG. 6, in some embodiments of the present disclosure, the storage node contact structure 4 is provided within the contact hole H, and the shape of the orthographic projection of the storage node contact structure 4 on the substrate 1 may be rectangular, square, circular or elliptical, etc. In some embodiments of the present disclosure, as illustrated in FIG. 6, the shape of the orthographic projection of the storage node contact structure 4 on the substrate 1 may be elliptical.

Figure 7:
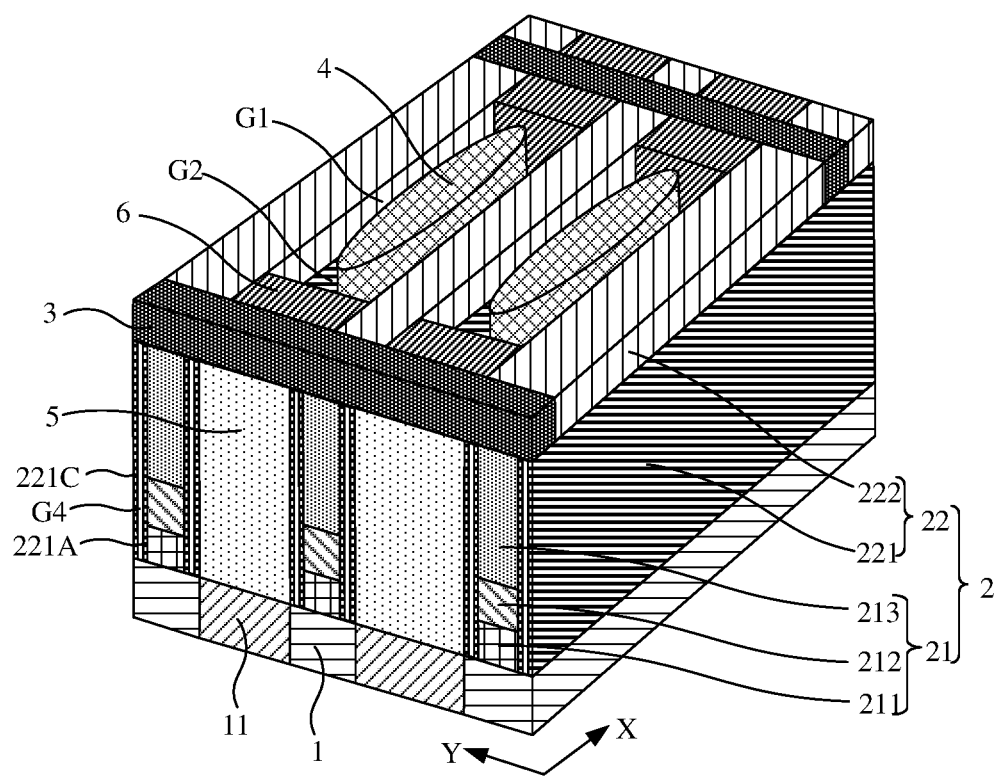
FIG. 7 is a schematic diagram of yet another semiconductor structure provided in an embodiment.

Referring to FIG. 7, in some embodiments of the present disclosure, the sidewall isolation structure 221 of the conductor structure 2 includes a fourth air gap structure G4. That is, the fourth air gap structure G4 may be formed in the sidewall isolation structure 221 of the wire structure 2, to further reduce the parasitic capacitance between the wire structure 2 and the storage node contact structure 4. For example, the sidewall isolation structure 221 includes a first sidewall 221A, a second sidewall 221C, and a fourth air gap structure G4 located between the first sidewall 221A and the second sidewall 221C. In addition, by way of example, the fourth air gap structure G4 is located on both sides of the wire 21 along the first direction X in some embodiments, or may be provided at one side of the wire 21. Also, one or more fourth air gap structures G4 may be provided on one side of the wire 21.

Figure 8:
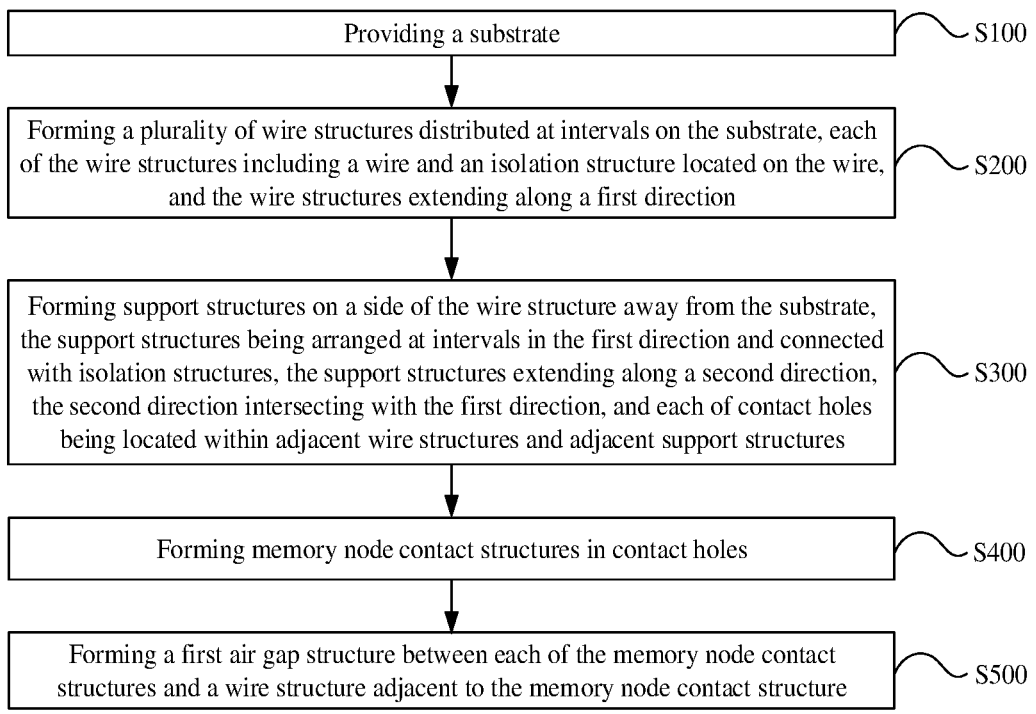
FIG. 8 is a flow diagram of a method for manufacturing a semiconductor structure provided in an embodiment.
Figure 9:
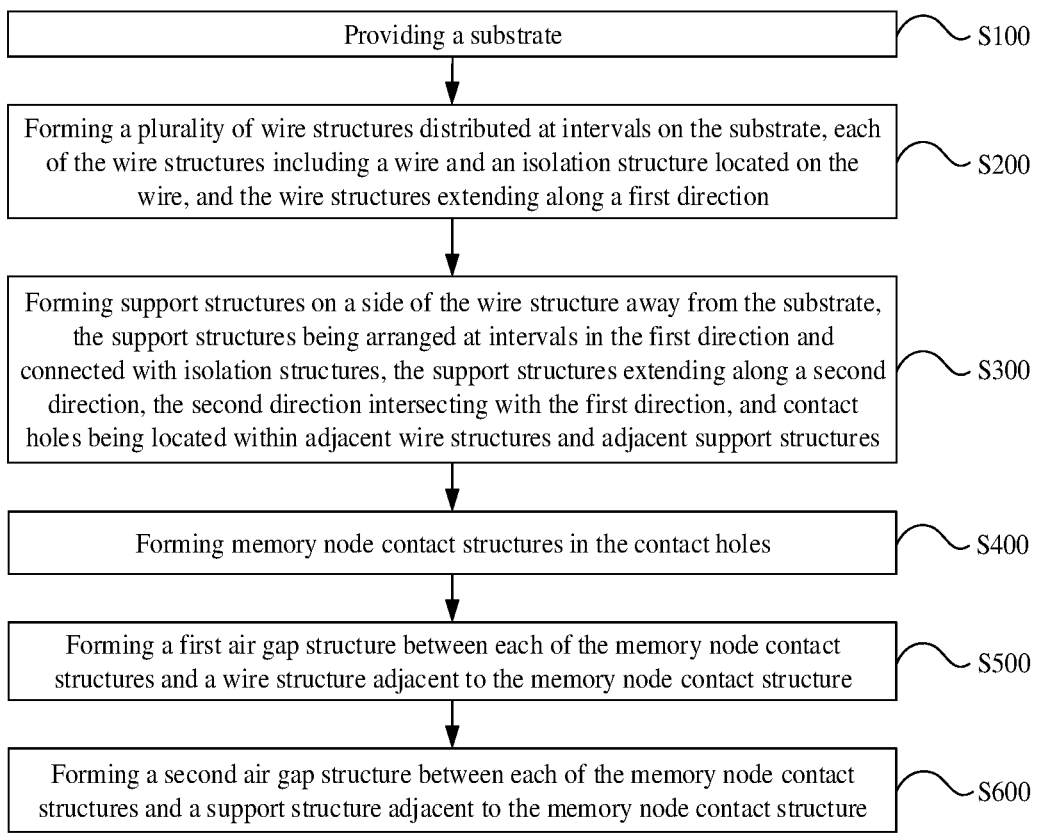
FIG. 9 is a flow diagram of another method for manufacturing a semiconductor structure provided in an embodiment.
Figure 10:
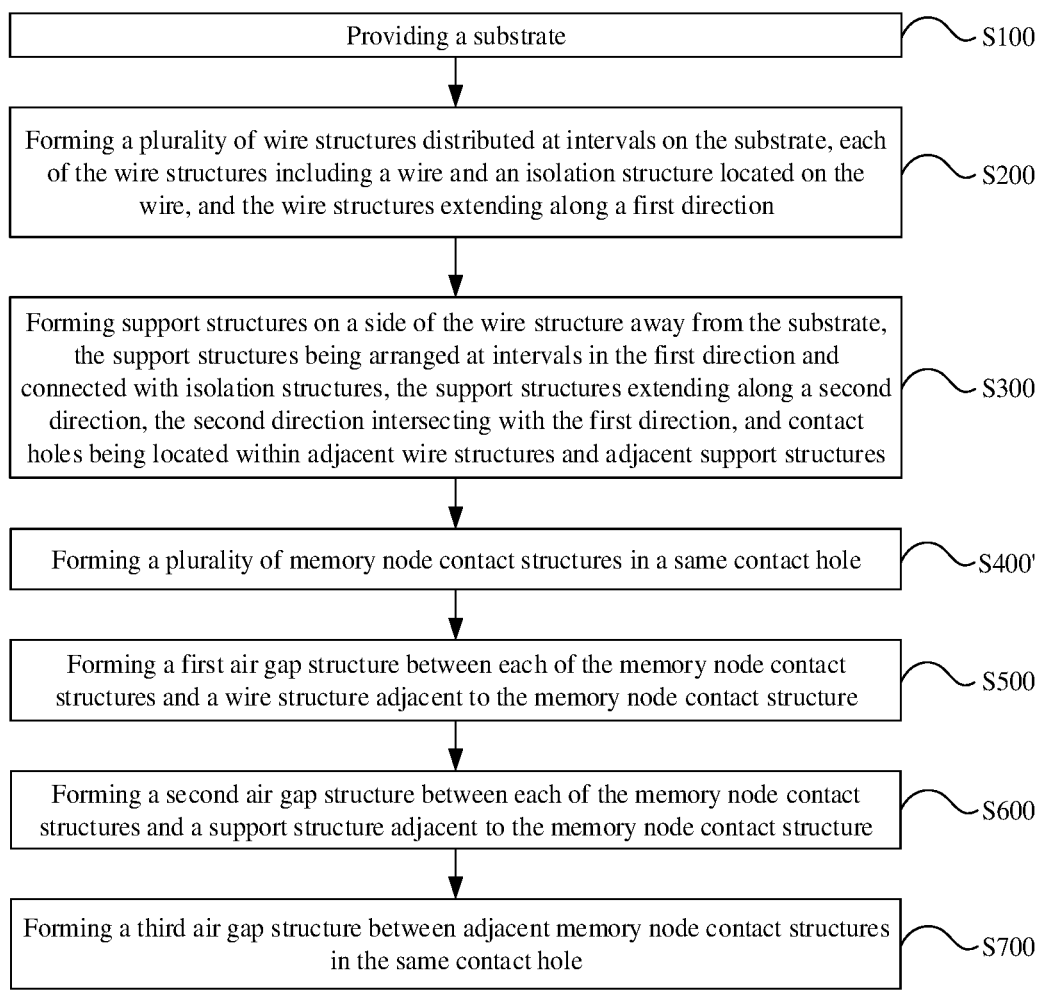
FIG. 10 is a flow diagram of yet another method for manufacturing a semiconductor structure provided in an embodiment.

Referring to FIG. 8-FIG. 10, there is provided a method for manufacturing a semiconductor structure. The method is used to manufacture a semiconductor structure as described in some of the above embodiments.

It is to be understood that in embodiments of the present disclosure, unless expressly stated herein, the execution of the operations is not strictly sequential, and the operations may not necessarily be performed in the described order, but may be performed in other ways. Further, at least a portion of any of the operations may include a plurality of sub-operations or a plurality of stages, these sub-operations or stages are not necessarily executed at the same time, but may be executed at different times, and the execution sequence of these sub-operations or stages is not necessarily sequential, but may be executed in turn or alternately with other operations or at least a part of sub-operations or stages of other operations.

In some embodiments of the present disclosure, referring to FIG. 8, a method for manufacturing a semiconductor structure includes the following operations.

At block S100, a substrate is provided.

At block S200, a plurality of wire structures distributed at intervals are formed on the substrate. Each of the wire structures includes a wire and an isolation structure located on the wire, and the wire structures extend along a first direction.

At block S300, support structures are formed on a side of the wire structures away from the substrate. The support structures are arranged at intervals in the first direction and connected with isolation structures, the support structures extend along a second direction, and the second direction intersects with the first direction. A contact hole is located within adjacent wire structures and adjacent support structures.

At block S400, storage node contact structures are formed in contact holes.

At block S500, a first air gap structure is formed between each of the storage node contact structures and a wire structure adjacent to the storage node contact structure.

In some embodiments of the present disclosure, referring to FIG. 9, the method may further include block S600: a second air gap structure is formed between each of the storage node contact structures and a support structure adjacent to the storage node contact structure.

In some embodiments of the present disclosure, referring to FIG. 10, the operation that the storage node contact structures are formed in the contact holes may include block S400': a plurality of storage node contact structures are formed in a same contact hole. Correspondingly, the method may further include block S700: a third air gap structure is formed between adjacent storage node contact structures in the same contact hole.

In embodiments of the present disclosure, the method for manufacturing a semiconductor structure is used to manufacture the semiconductor structure in some of the preceding embodiments. The technical advantages of the aforementioned semiconductor structure are also possessed by the manufacturing method, which will not be described in detail here.

It is worth mentioning that the semiconductor structure in some of the foregoing embodiments also includes first dielectric layers. Based on this, in some embodiments of the present disclosure, after the support structures are formed on the side of the wire structures away from the substrate in block S300, the method further includes that: a first dielectric material layer is filled between the adjacent wire structures, below the support structures and between the adjacent support structures. Block S400 may be correspondingly represented as follows: the storage node contact structures are formed in the first dielectric material layer in each of the contact holes. Block S500 may be correspondingly represented as follows: part of the first dielectric material layer is removed, a first dielectric layer located between adjacent wire structures and below the support structures is formed, and the first air gap structure located between each of the storage node contact structures and the wire structure adjacent to the storage node contact structure is formed.

In some embodiments of the present disclosure, block S600 may be correspondingly represented as follows: during a process of removing the part of the first dielectric material layer, a second air gap structure is formed located between each of the storage node contact structures and the support structure adjacent to the storage node contact structure.

In some embodiments of the present disclosure, block S400 may be further represented as follows: a plurality of storage node contact structures are formed in a same contact hole. Block S700 may be correspondingly represented as follows: during a process of removing the part of the first dielectric material layer, a third air gap structure located between adjacent storage node contact structures is formed.

Further, in some embodiments of the present disclosure, block S400 may be further represented as follows: after the first dielectric material layer is filled, part of the first dielectric material layer is removed, storage node contact holes are formed, and a conductive material is filled in the storage node contact holes to form the storage node contact structures.

It will be understood that the semiconductor structure in some of the foregoing embodiments also includes second dielectric layers. In some embodiments of the present disclosure, the method may further include that: a second dielectric layer located between a storage node contact structure and a support structure is formed in each of the contact holes.

In some embodiments of the present disclosure, block S600 may be correspondingly represented as follows: the method may further include that: a second air gap structure is formed between each of the storage node contact structures and a second dielectric layer adjacent to the storage node contact structure.

In embodiments of the present disclosure, the method for manufacturing a semiconductor structure is used to manufacture the semiconductor structure in some of the preceding embodiments. The technical advantages of the aforementioned semiconductor structure are also possessed by the manufacturing method, which will not be described in detail here.

In order to explain more clearly the method for manufacturing the semiconductor structure in the embodiments of the present disclosure, some of the following embodiments take the semiconductor structure illustrated in FIG. 6 as an example, and some of the possible manufacturing methods thereof are described in detail. Other semiconductor structures different from the semiconductor structure illustrated in FIG. 6 can be manufactured by referring to the relevant parts in the following manufacturing methods.

Figure 11:
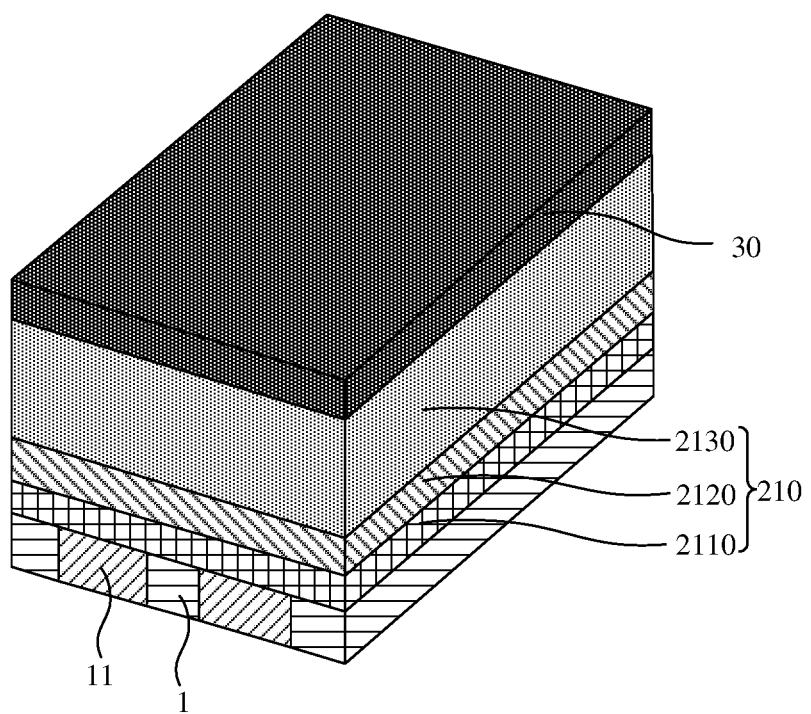
FIG. 11 is a schematic diagram of a structure obtained after depositing a support material layer provided in an embodiment.

At block S100, referring to FIG. 11, a substrate 1 is provided. The substrate 1 includes but is not limited to a silicon substrate or a silicon-based substrate. The substrate 1 has a shallow trench isolation structure 11, by which the active region is isolated and formed within substrate 1. In some embodiments of the present disclosure, the shallow trench isolation structure 11 is a silicon oxide (SiO2) isolation structure. A plurality of active regions arranged in an array are isolated and formed within the substrate 1 by the shallow trench isolation structure 11.

At block S200 and block S300, the forming processes of the wire structure 2 and the support structure 3 have overlapping parts, which are described in detail below.

Referring to FIG. 11, a wire material layer 210 is deposited on the substrate 1. Depending on the structure of the wire 21, the wire material layer 210 may be a single material layer or a laminated material layer. For example, a first conductive material layer 2110, a second conductive material layer 2120 and an insulating material layer 2130 are sequentially stacked on the substrate 1 along a direction away from the substrate 1.

Referring to FIG. 11, a support material layer 30 is deposited on the wire material layer 210. The support material layer 30 is for example a silicon carbon nitrogen (SiCN) material layer.

Figure 12:
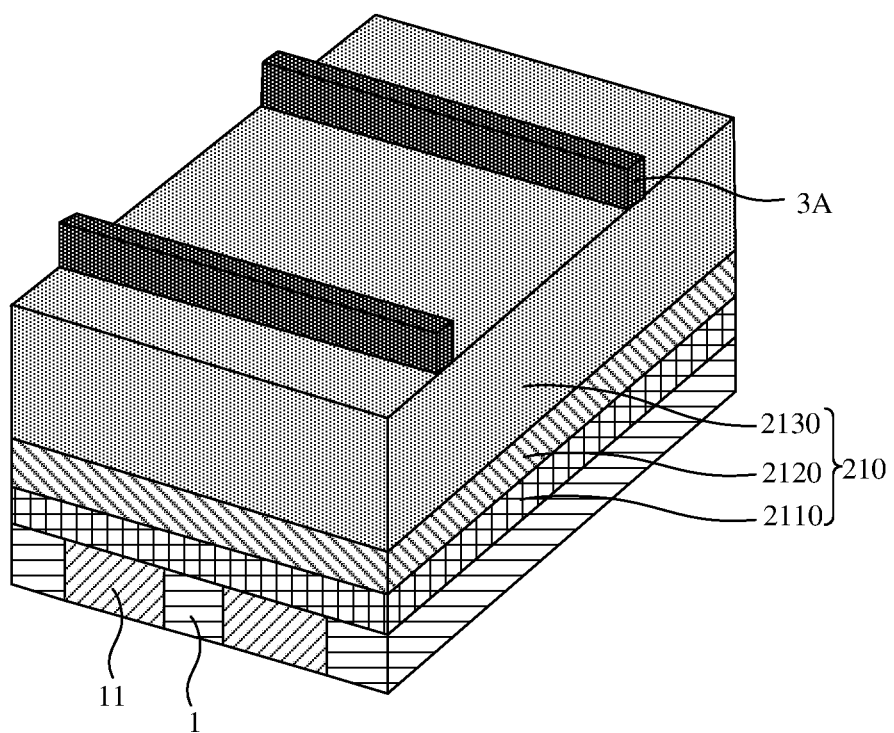
FIG. 12 is a schematic diagram of a structure obtained after forming initial support structures provided in an embodiment.

Referring to FIG. 12, the support material layer 30 is patterned to form initial support structures 3A.

Figure 13:
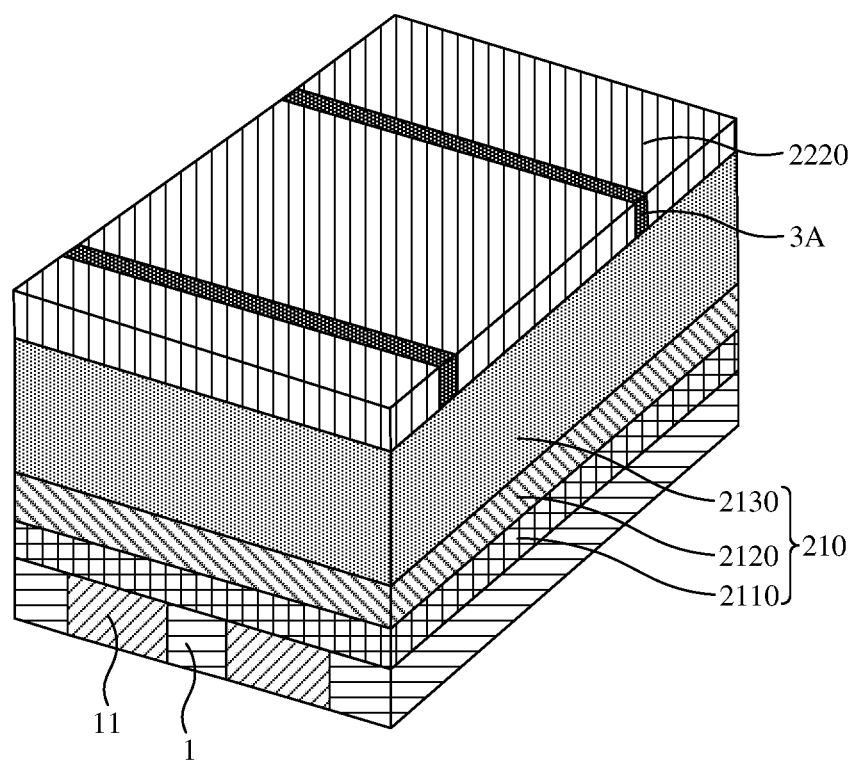
FIG. 13 is a schematic diagram of a structure obtained after depositing top insulation material layers provided in an embodiment.

Referring to FIG. 13, on the structure after forming the initial support structures 3A, a top isolation material layer 2220 is deposited. In some embodiments of the present disclosure, the upper surface of the top isolation material layers 2220 is aligned with the upper surface of the initial support structures 3A. In some embodiments of the present disclosure, the top isolation material layers 2220 may be a silicon nitride material layer.

A first photoresist pattern is formed. The entity pattern of the first photoresist pattern is the same as the arrangement pattern of the wires 21. That is, according to the hollow pattern of the first photoresist pattern, portion to be removed in each material layer on the substrate 1 can be removed.

Figure 14:
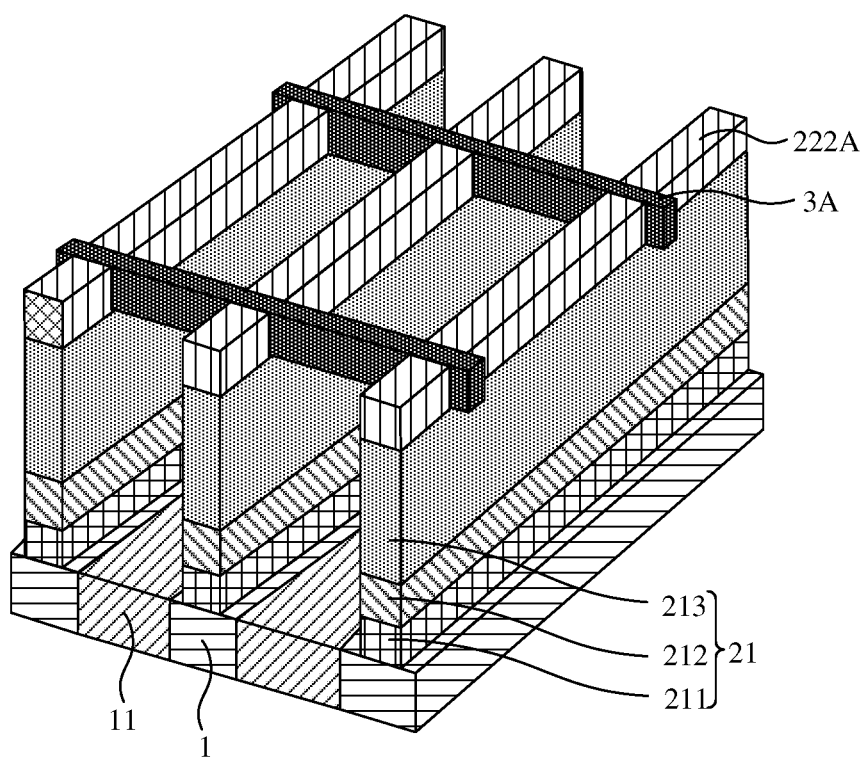
FIG. 14 is a schematic diagram of a structure obtained after forming wires and initial top isolation structures provided in an embodiment.

Referring to FIG. 14, after etching with the first photoresist pattern as a mask, the wires 21 and the initial top isolation structures 222A located on the wires 21 can be obtained, and the initial support structures 3A are exposed at the same time. The wires 21 extend in a first direction and the initial support structures 3A extend in a second direction. The first direction intersects with the second direction, such as perpendicular.

Figure 15:
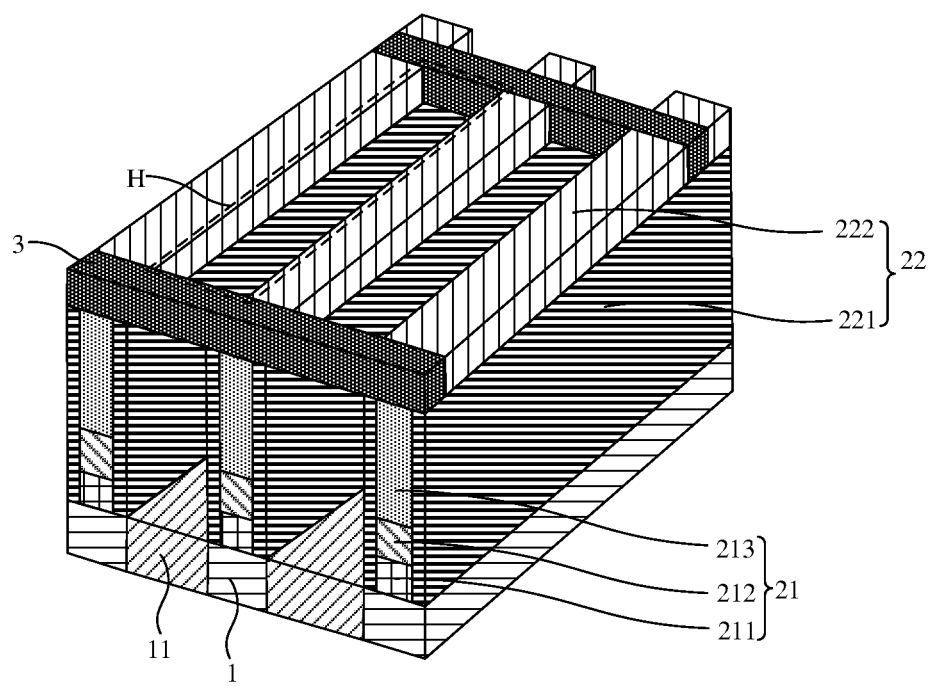
FIG. 15 is a schematic diagram of a structure obtained after forming wire structures and support structures provided in an embodiment.

Referring to FIG. 15, on the structure after forming the initial top isolation structures 222A and exposing the initial support structures 3A, a dielectric material is deposited to form the top isolation structures 222, the support structures 3, and the sidewall isolation structures 221 covering the sidewalls of the wires 21.

Here, the sidewall isolation structures 221 may be formed by a dielectric material having a higher dielectric constant such as a single dielectric layer or a stack of multiple dielectric layers. In some embodiments of the present disclosure, the sidewall isolation structures 221 are used to insulate the corresponding wire 21 and may employ a structure formed by stacking a first silicon nitride layer, a silicon oxide layer and a second silicon nitride layer. Accordingly, the dielectric material used to form the sidewall isolation structures 221 may be with one or more types.

In addition, in some embodiments of the present disclosure, each of the sidewall isolation structures 221 includes a fourth air gap structure. By way of example, the fourth air gap structure G4 is located on both sides of the wire 21 along the first direction X in some embodiments, or may be provided at one side of the wire 21. Also, one or more fourth air gap structures G4 may be provided on one side of the wire 21.

For example, referring to FIG. 7, the sidewall isolation structure 221 includes, for example, a first sidewall 221A, a second sidewall 221C, and a fourth air gap structure G4 located between the first sidewall 221A and the second sidewall 221C. Thus, a method for manufacturing the sidewall isolation structure 221 and the top isolation structure 222 can be performed with reference to FIG. 16 to FIG. 18.

Figure 16:
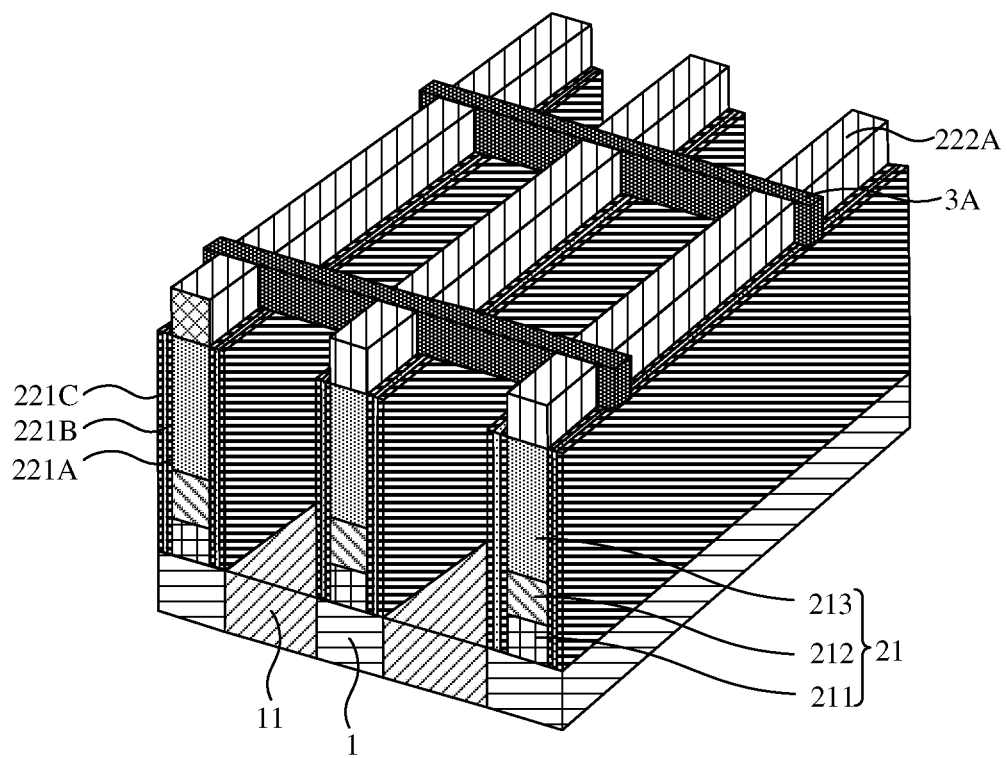
FIG. 16 is a schematic diagram of a structure obtained after forming first sidewalls, sacrificial layers and second sidewalls provided in an embodiment.

Referring to FIG. 16, on the structure after forming the initial top isolation structures 222A and exposing the initial support structures 3A, first sidewalls 221A, sacrificial layers 221B, and second sidewalls 221C are sequentially formed along a direction away from the sidewall of the wire 21. The first sidewalls 221A cover the sidewalls of the wire 21.

Figure 17:
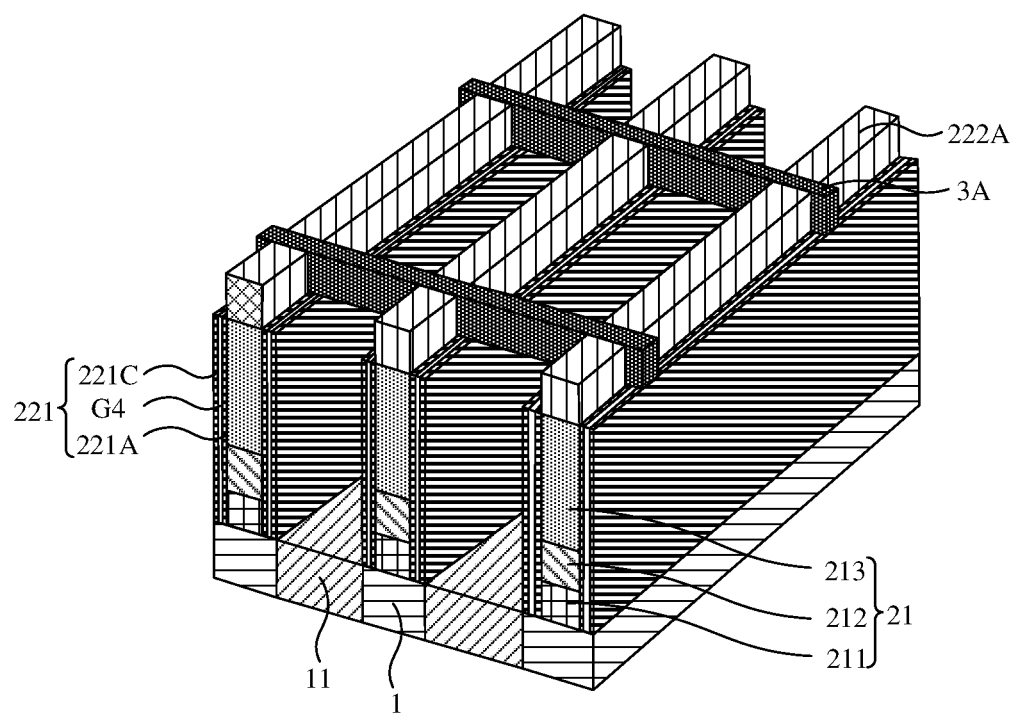
FIG. 17 is a schematic diagram of a structure obtained after forming fourth air gap structures provided in an embodiment.

Referring to FIG. 17, the sacrificial layer 221B is etched off, and the fourth air gap structure G4 is formed between the first sidewall 221A and the second sidewall 221C, to form the sidewall isolation structure 221.

Figure 18:
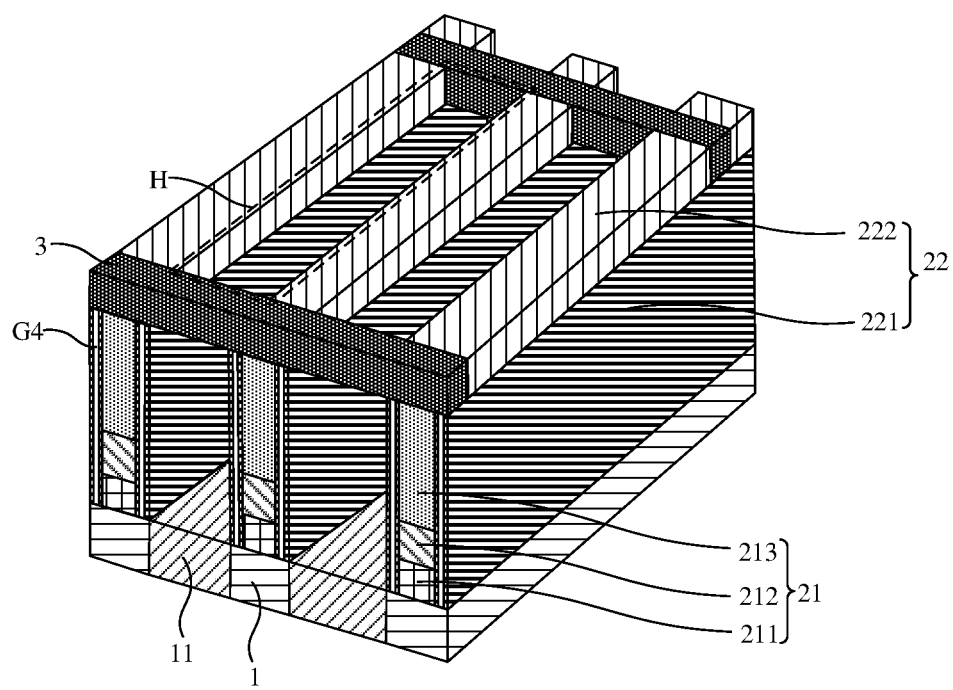
FIG. 18 is a schematic diagram of a structure obtained after forming another type of wire structures and support structures provided in an embodiment.

Referring to FIG. 18, the dielectric material is deposited on the initial top isolation structures 222A and the initial support structures 3A to form the top isolation structures 222 and the support structures 3.

In view of the above, in the obtained structure illustrated in FIG. 15 and FIG. 18, each operation of forming the wire structures 2 and the support structures 3 on the substrate 1 has been completed, and there are contact holes H between the adjacent conductive structures 2 and the adjacent support structures 3.

Figure 19:
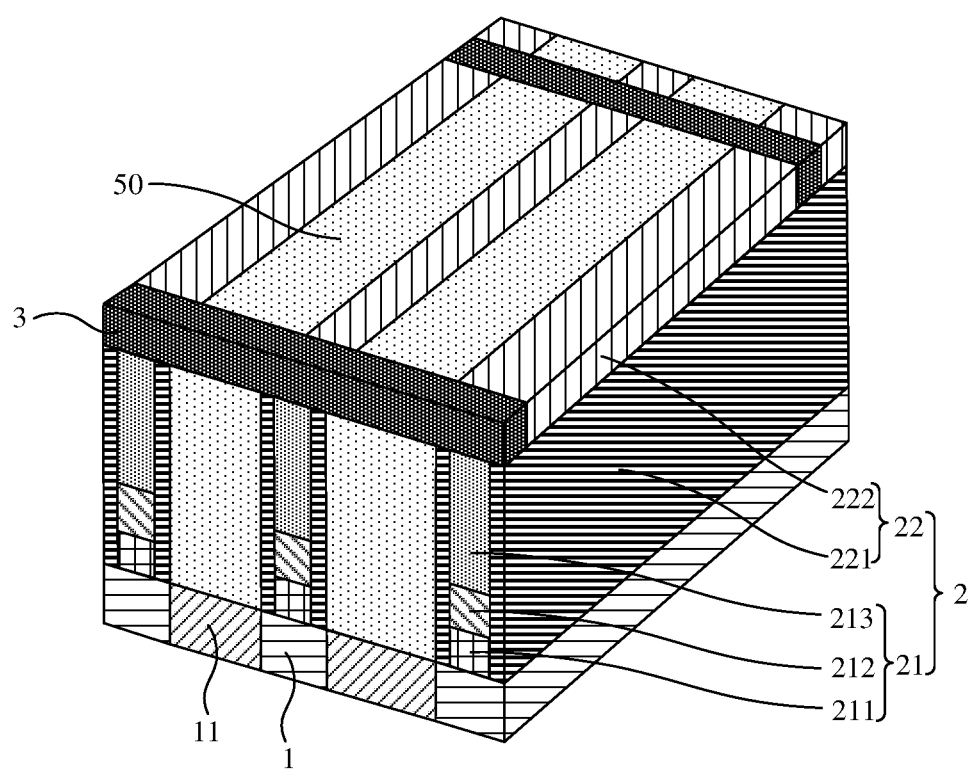
FIG. 19 is a schematic diagram of a structure obtained after filling a first dielectric material layer provided in an embodiment.

After the operation at block S300, referring to FIG. 19, a first dielectric material layer 50 is filled between the adjacent wire structures 2, below the support structures 3 and between the adjacent support structures 2. The first dielectric material layer 50 is an insulating material layer, such as a silicon oxide material layer. In some embodiments of the present disclosure, the upper surface of the first dielectric material layer 50 is aligned with the upper surface of the support structures 3. That is, the first dielectric material layer 50 fills the holes in the structure obtained after forming the wire structures 2 and the support structures 3.

On the structure after filling the first dielectric material layers 50, a first hard mask layer and a first etch barrier layer are stacked in sequence along a direction away from the substrate 1, and a second photoresist pattern is formed on the surface of the first etch barrier layer. After an etch opening is formed in the first etch barrier layer and the first hard mask layer based on the second photoresist pattern, part of the first dielectric material layer 50 may be etched off by using the etch opening. The first hard mask layer is, for example, a spin-on hardmask (SOH) layer. The first etch barrier layer is, for example, a silicon oxide nitride (SiON) layer.

Figure 20:
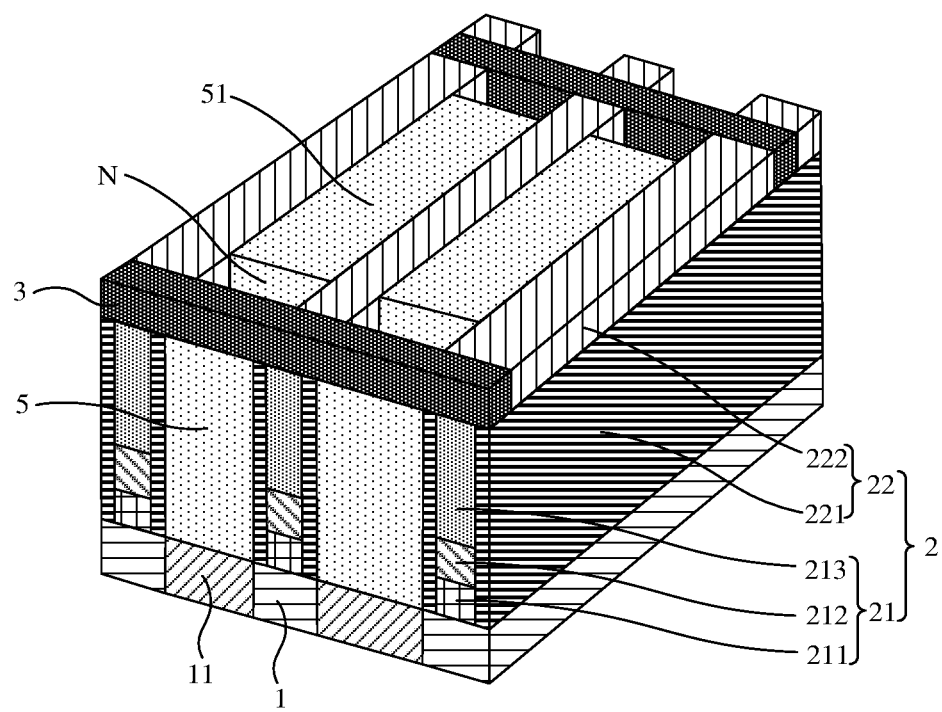
FIG. 20 is a schematic diagram of a structure obtained after forming first dielectric layers provided in an embodiment.

Referring to FIG. 20, after removing part of the first dielectric material layer 50, first dielectric layers 5 located below the support structures 3, first residual portions 51 of the first dielectric material layer 50 and grooves N may be formed. Each of the grooves N is located between a first dielectric layer 5 and a first residual portion 51.

Figure 21:
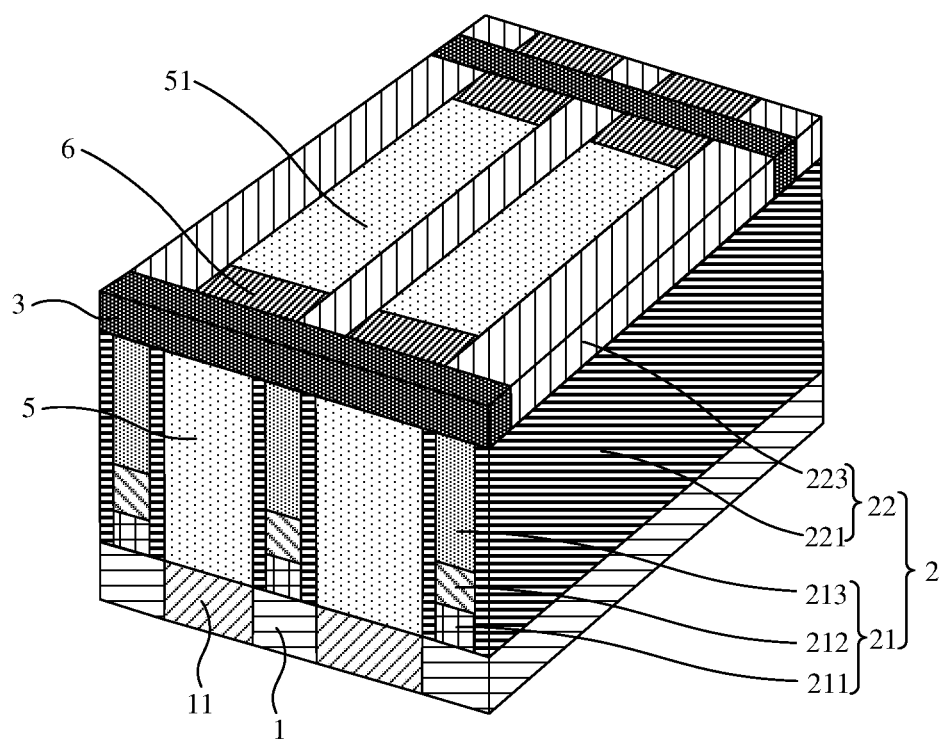
FIG. 21 is a schematic diagram of a structure obtained after forming second dielectric layers provided in an embodiment.

Referring to FIG. 21, a second dielectric layer 6 is formed in a groove N. In some embodiments of the present disclosure, the second dielectric layer 6 and the first dielectric layer 5 are formed of different materials. The second dielectric layer 6 is, for example, a silicon nitride layer. In some embodiments of the present disclosure, the upper surface of the second dielectric layer 6 is aligned with the upper surface of the support structure 3.

Figure 22:
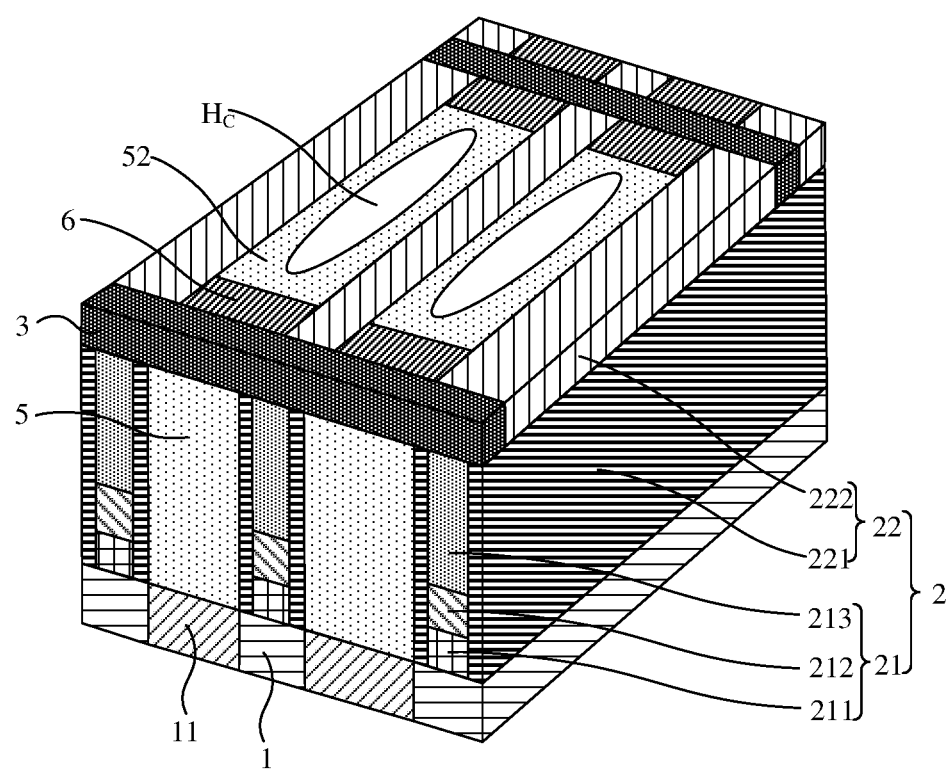
FIG. 22 is a schematic diagram of a structure obtained after forming storage node contact holes $H_C$ provided in an embodiment.

On the structure obtained after forming the second dielectric layers 6, a second hard mask layer and a second etch barrier layer are stacked in sequence along a direction away from the substrate 1, and a third photoresist pattern is formed on the surface of the second etch barrier layer. The third photoresist pattern may have the same hole as the storage node contact hole $H_C$. After an etch opening is formed in the second etch barrier layer and the second hard mask layer based on the third photoresist pattern, part of the first residual portions 51 may be etched off by using the etch opening to form the storage node contact hole $H_C$ and the second residual portions 52, for example, as illustrated in FIG. 22.

Here, the second hard mask layer is, for example, a spin-on hardmask (SOH) layer. The second etch barrier layer is, for example, a silicon oxide nitride (SiON) layer. The storage node contact hole $H_C$ can be a cylindrical hole, an elliptical cylindrical hole, a rectangular cylindrical hole or a special-shaped cylindrical hole. The embodiment of the present disclosure is not limited to the shape and size of the storage node contact hole $H_C$.

Figure 23:
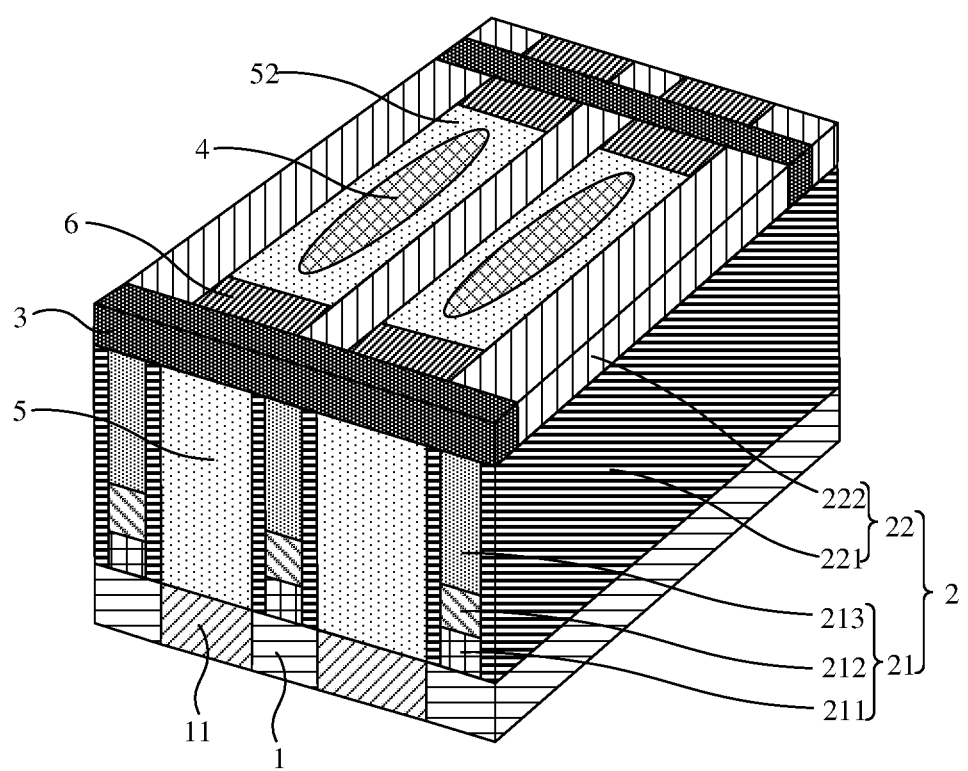
FIG. 23 is a schematic diagram of a structure obtained after forming storage node contact structures provided in an embodiment.

Referring to FIG. 23, storage node contact structures 4 are formed in a storage node contact hole $H_C$. The shape of the storage node contact structure 4 may be formed to match the shape of the storage node contact hole $H_C$. The storage node contact structure 4 may be, for example, a single-layer structure or a stacked structure. In some embodiments of the present disclosure, the storage node contact structure 4 is a doped polysilicon layer. In some embodiments of the present disclosure, the storage node contact structure 4 includes a first conductive layer, a barrier layer and a second conductive layer stacked in sequence along a direction away from the substrate 1. The first conductive layer is, for example, a doped polysilicon layer. The barrier layer is, for example, a titanium layer. The second conductive layer is, for example, a tungsten metal layer. But it's not limited to that.

Figure 24:
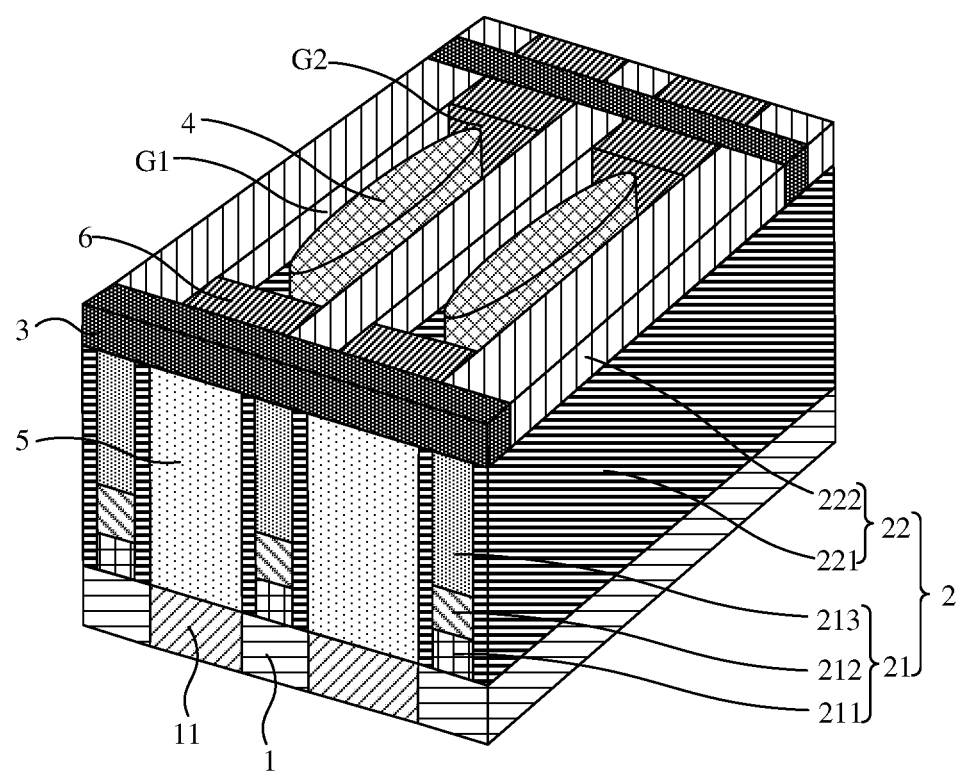
FIG. 24 is a schematic diagram of a structure obtained after forming first air gap structures and second air gap structures provided in an embodiment.

Referring to FIG. 24, removing the second residue portion 52 may result in the first air gap structure G1 between the storage node contact structure 4 and the wire structure 2 adjacent to the storage node contact structure 4, and the second air gap structure G2 between the storage node contact structure 4 and the support structure 3 adjacent to the storage node contact structure 4 (e.g., the adjacent second dielectric layer 6). The embodiment of the present disclosure does not limit the volume and shape of the air gap in the first air gap structure G1 and the air gap in the second air gap structure G2, and can be selected and set according to actual requirements. In some embodiments of the present disclosure, an air gap in the second air gap structure G2 is communicated with an air gap in the first air gap structure G1.

In other examples, the second air gap structure G2 and the first air gap structure G1 may be formed step by step.

It will be understood that, in other examples, the second residual portions 52 are used to separate and limit the contours of multiple storage node contact holes $H_C$, multiple storage node contact structures 4 can be formed in the same contact hole H, and adjacent storage node contact structures 4 may be insulated by the second residual portions 52. Thus, after the second residual portions 52 are removed, the third air gap structure G3 may also be formed between the adjacent storage node contact structures 4. The embodiment of the present disclosure does not limit the volume and shape of the air gap in the third air gap structure G3, and can be selected and set according to actual requirements. In some embodiments of the present disclosure, an air gap in the third air gap structure G3 is communicated with an air gap in the second air gap structure G2 and/or an air gap in the first air gap structure G1.

In other examples, the third air gap structure G3 may also be formed step by step with the second air gap structure G2 or the first air gap structure G1.

The technical features of the above-described embodiments may be arbitrarily combined, and all possible combinations of the technical features of the above-described embodiments have not been described in order to make the description concise. However, as long as there is no contradiction in the combinations of these technical features, they should be considered as the scope described in this specification.

The above-described embodiments are intended to express only a few implementation rights of the present disclosure, and the description thereof is more specific and detailed, but should not therefore be construed as limiting the scope of the patent application. It should be noted that for those of ordinary skill in the art, there are several variations and improvements that can be made without deviating from the ideas of this disclosure, which fall within the scope of protection of this disclosure. Therefore, the scope of protection of this disclosure shall be subject to the appended claims.

What is claimed is:

1. A method for manufacturing a semiconductor structure, comprising:
   providing a substrate;
   forming a plurality of wire structures distributed at intervals on the substrate, wherein each of the wire structures comprises a wire and an isolation structure located on the wire, and the wire structures extend along a first direction;
   forming support structures on a side of the wire structures away from the substrate, wherein the support structures are arranged at intervals in the first direction and connected with isolation structures, the support structures extend along a second direction, the second direction intersects with the first direction, and a contact hole is located within adjacent wire structures and adjacent support structures;
   forming storage node contact structures in contact holes; and
   forming a first air gap structure between each of the storage node contact structures and a wire structure adjacent to the storage node contact structure;
   wherein after forming the support structures on the side of the wire structures away from the substrate, the method further comprises:
   filling a first dielectric material layer between the adjacent wire structures, below the support structures and between the adjacent support structures; forming the storage node contact structures in the first dielectric material layer in each of the contact holes; and
   removing part of the first dielectric material layer, forming a first dielectric layer located between adjacent wire structures and below the support structures, and forming the first air gap structure located between each of the storage node contact structures and the wire structure adjacent to the storage node contact structure.

2. The method for manufacturing the semiconductor structure of claim 1, further comprising:
   forming a second air gap structure between each of the storage node contact structures and a support structure adjacent to the storage node contact structure.

3. The method for manufacturing the semiconductor structure of claim 1, wherein
   forming the storage node contact structures in the contact holes comprises:
   forming a plurality of storage node contact structures in a same contact hole; and
   the method further comprises: forming a third air gap structure between adjacent storage node contact structures in the same contact hole.

4. The method for manufacturing the semiconductor structure of claim 1, wherein
   the method further comprises: during a process of removing the part of the first dielectric material layer, forming a second air gap structure located between each of the storage node contact structures and the first dielectric layer.

5. The method for manufacturing the semiconductor structure of claim 1, wherein
forming the storage node contact structures in the first dielectric material layer in each of the contact holes comprises:
after filling the first dielectric material layer, removing part of the first dielectric material layer, forming storage node contact holes, and filling a conductive material in the storage node contact holes to form the storage node contact structures.

6. The method for manufacturing the semiconductor structure of claim 5, wherein
the method further comprises:
forming, in each of the contact holes, a second dielectric layer located between a storage node contact structure and a support structure.

7. The method for manufacturing the semiconductor structure of claim 6, wherein
the method further comprises: forming a second air gap structure between each of the storage node contact structures and a second dielectric layer adjacent to the storage node contact structure.

8. The method for manufacturing the semiconductor structure of claim 1, wherein
forming the storage node contact structures in the first dielectric material layer in each of the contact holes comprises: forming a plurality of storage node contact structures in a same contact hole; and
the method further comprises: during a process of removing the part of the first dielectric material layer, forming a third air gap structure located between adjacent storage node contact structures.

9. The method for manufacturing the semiconductor structure of claim 1, wherein
each of the isolation structures comprises sidewall isolation structures and a top isolation structure; and
wherein forming the plurality of wire structures distributed at intervals on the substrate further comprises:
forming the sidewall isolation structures on sidewalls of the wire, wherein each of the sidewall isolation structures comprises a fourth air gap structure; and
forming the top isolation structure on the sidewall isolation structures and the wire.

* * * * *